(12) United States Patent
Yu et al.

(10) Patent No.: US 11,694,836 B2
(45) Date of Patent: Jul. 4, 2023

(54) ON-CHIP MULTI-LAYER TRANSFORMER AND INDUCTOR

(71) Applicant: Intel Corporation, Santa Clara, CA (US)

(72) Inventors: Chuanzhao Yu, Phoenix, AZ (US); Qiang Li, Gilbert, AZ (US); David Newman, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 242 days.

(21) Appl. No.: 16/958,049

(22) PCT Filed: Mar. 30, 2018

(86) PCT No.: PCT/US2018/025550
§ 371 (c)(1),
(2) Date: Jun. 25, 2020

(87) PCT Pub. No.: WO2019/190565
PCT Pub. Date: Oct. 3, 2019

(65) Prior Publication Data
US 2021/0065963 A1    Mar. 4, 2021

(51) Int. Cl.
*H01F 27/28*    (2006.01)
*H01F 41/04*    (2006.01)

(52) U.S. Cl.
CPC ....... *H01F 27/2804* (2013.01); *H01F 41/041* (2013.01); *H01F 2027/2809* (2013.01)

(58) Field of Classification Search
CPC ............... H01F 27/2804; H01F 43/043; H01F 2027/2809
See application file for complete search history.

(56) References Cited

U.S. PATENT DOCUMENTS

| 2004/0108927 A1 | 6/2004 | Castaneda et al. |
| 2005/0054152 A1 | 3/2005 | Lowther et al. |

(Continued)

FOREIGN PATENT DOCUMENTS

| KR | 20090076840 A | 7/2009 |
| WO | WO-2019190565 A1 | 10/2019 |

OTHER PUBLICATIONS

"International Application Serial No. PCT US2018 025550, International Preliminary Report on Patentability dated Oct. 15, 2020", 10 pgs.

(Continued)

*Primary Examiner* — Quan Tra
(74) *Attorney, Agent, or Firm* — Schwegman Lundberg & Woessner, P.A.

(57) ABSTRACT

A stacked transformer or inductor apparatus including a first layer with a first layer wire element extending around a center axis and a second layer with a second layer wire element. The second layer element includes side by side first and second wire components in parallel spaced relation extending around the center axis and the first wire component is connected to the first layer wire element to form a primary turn winding. A third layer includes a third layer wire element extending around the center axis and connected to the second wire component of the second layer wire element to form a secondary turn winding partially overlapping with the primary turn winding.

19 Claims, 14 Drawing Sheets

(56) References Cited

U.S. PATENT DOCUMENTS

| | | | |
|---|---|---|---|
| 2006/0091958 A1 | 5/2006 | Bhatti et al. | |
| 2009/0174515 A1* | 7/2009 | Lee | H01F 27/2804 336/182 |
| 2012/0223176 A1 | 9/2012 | Papananos | |
| 2013/0265132 A1 | 10/2013 | Huang et al. | |
| 2014/0240063 A1 | 8/2014 | Leuschner et al. | |
| 2017/0345559 A1* | 11/2017 | Vanukuru | H01F 19/04 |

OTHER PUBLICATIONS

"European Application Serial No. 18911921.7, Extended European Search Report dated Oct. 11, 2021", 7 pgs.

"International Application Serial No. PCT/US2018/025550, International Search Report dated Dec. 26, 2018", 3 pgs.

"International Application Serial No. PCT/US2018/025550, Written Opinion dated Dec. 26, 2018", 8 pgs.

Niknejad, Ali M., "Passive Devices for Communication Integrated Circuits", (2014), 100 pgs.

* cited by examiner

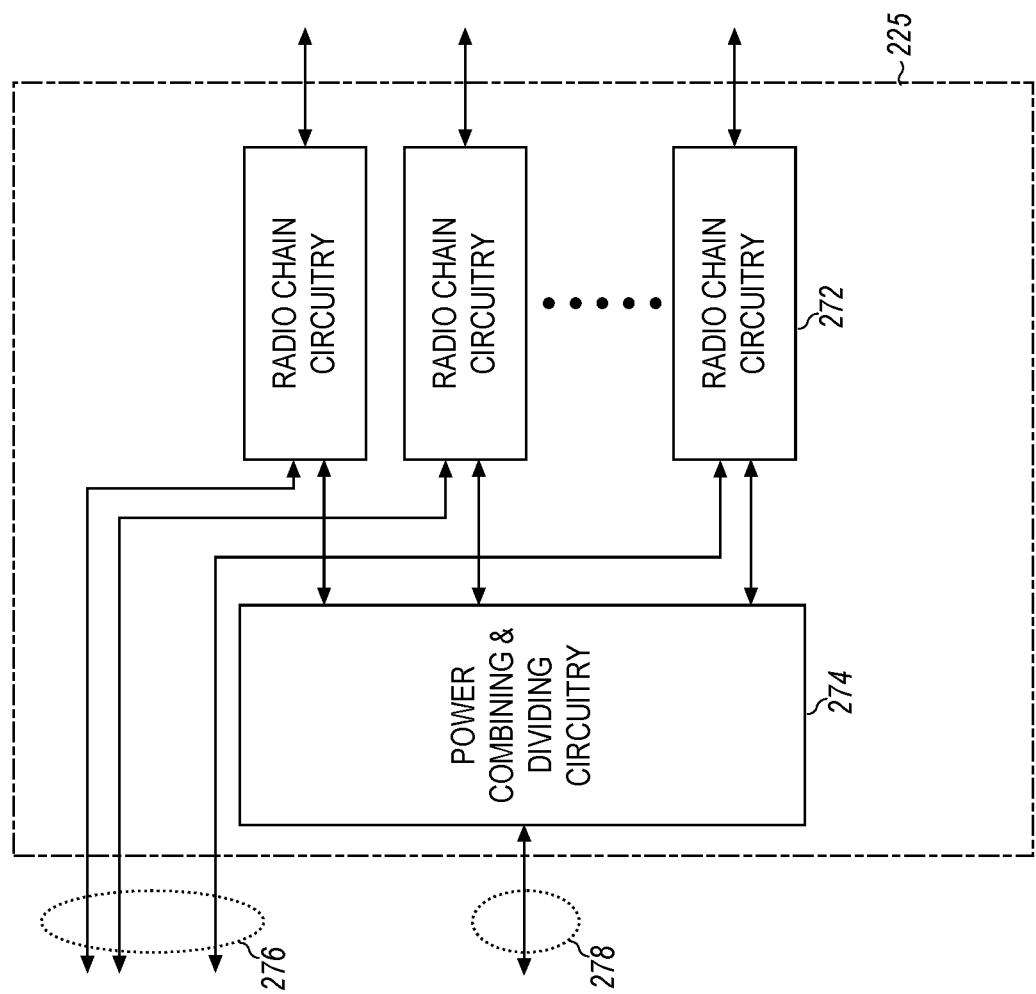

ON-CHIP MULTI-LAYER TRANSFORMER AND INDUCTOR

CROSS-REFERENCE TO RELATED APPLICATION

This application is a U.S. National Stage Filing under 35 U.S.C. 371 from International Application No. PCT/US2018/025550, filed on 30 Mar. 2018, and published as WO 2019/190565 A1 on 03 Oct. 2019, which application is incorporated herein by reference in its entirety.

TECHNICAL FIELD

This document pertains generally, but not by way of limitation, to transformers. More specifically, this document pertains to multi-layered integrated on-chip transformers for use in electronic devices.

BACKGROUND

Transformers are electronic devices that are formed from multiple metal windings, often winding about a common core. When current flows through a primary winding, an electromagnetic field is created such that electrical energy is induced from the primary winding to a secondary winding. The induction occurs such that frequency and energy remain constant while voltage and current may be altered.

Electronic devices utilize transformers in this manner. Typically, in electronic devices, primary and secondary windings are present without a core. Such transformers are utilized in association within integrated circuits (ICs), chips, and the like. Electronic devices, meanwhile, include memory devices, modern processors, such as a central processing unit (CPU), a graphics processing unit (GPU), advanced processing unit (APU), or combinations thereof, and the like.

When forming transformers for these devices, numerous challenges exist during the manufacturing process. In particular, such devices continue to be miniaturized, providing design and spatial constraints. As manufacturing techniques are created to efficiently form these components, the transformers similarly, must be improved to take advantage of state of the art manufacturing techniques while minimizing performance loss of the product.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document.

FIG. 2D illustrates aspects of exemplary radio frequency circuitry illustrated in FIG. 2A according to some aspects.

DETAILED DESCRIPTION

Figure 1:
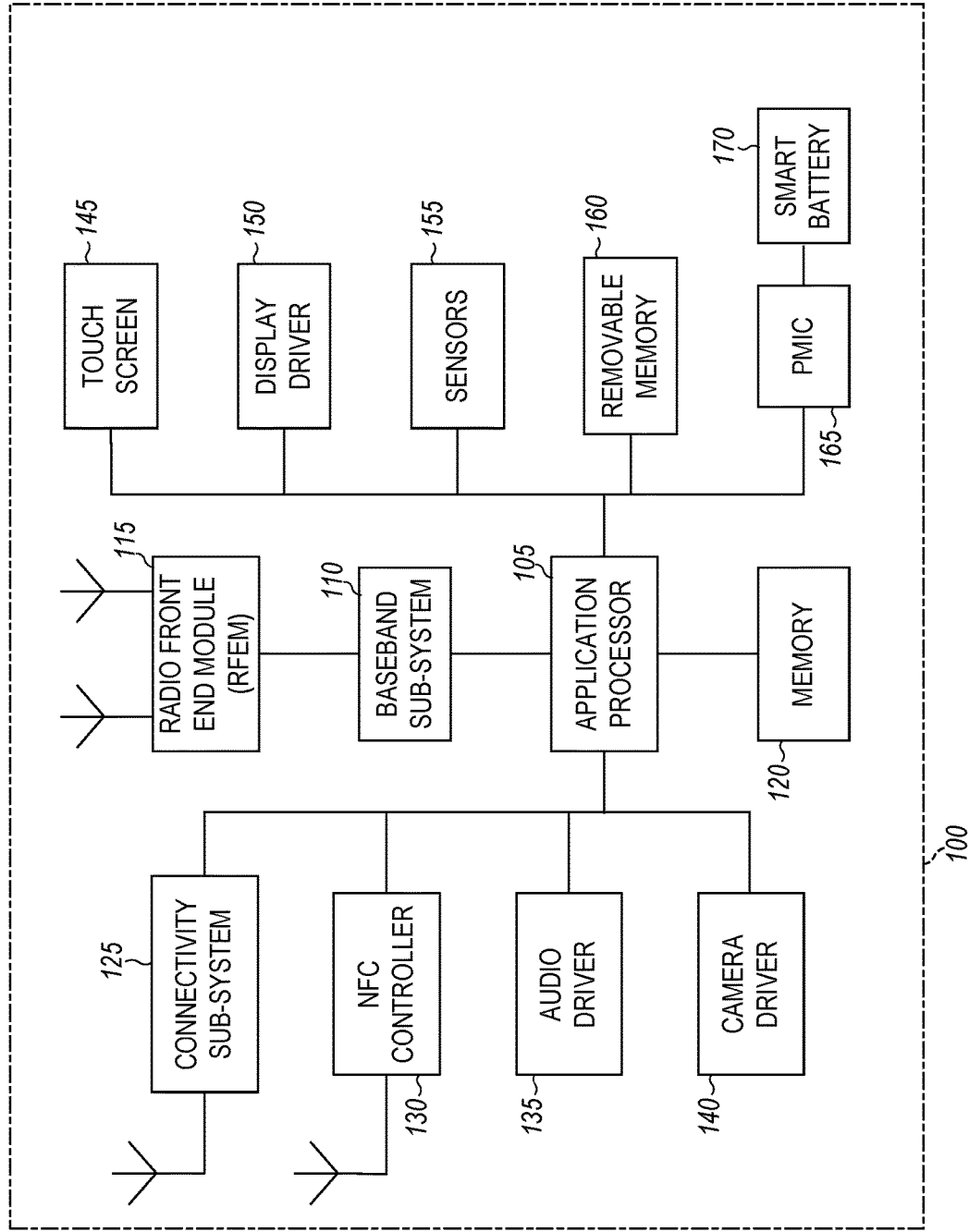
FIG. 1 illustrates an exemplary user device according to some aspects.

Numerous characteristics of a transformer are taken into account when determining performance of the transformer. A first characteristic is the insertion loss of the transformer. Insertion loss is a manner of measuring efficiency in a transformer by determining the power consumed by the transformer measured in decibels. A second characteristic is transformer resistance measured by determining the resistance of the material of the windings of the transformer. Another characteristic, related to the transformer resistance is the quality factor (Q).

Vertical winding transformers stack numerous layers of primary and secondary windings on top of one another to enhance performance of a transformer through an enhanced mutual coupling factor (k), improving insertion loss of the transformer. Despite improved mutual coupling, vertical winding transformers form significant mutual capacitance generating undesired levels of self-resonance frequency. In addition, current manufacturing techniques for manufacturing complimentary metal-oxide-semiconductors (CMOS) only allow a single layer of metal that is applied to a device such that only a single layer of a multi-stacked vertical winding is able be formed from low resistant metal (measured in ohms per square micrometers). Thus, when a stacked primary winding and secondary winding are provided in a vertical winding transformer, only the primary side or the secondary side of a transformer is formed of the low resistant metal, increasing resistance of the transformer and minimizing quality factor Q.

Horizontal winding transformers meanwhile provide primary and secondary windings in side-by-side relation allowing for CMOS manufacturing techniques to be utilized that result in both windings to be formed of low resistant metal. Still, by spacing the primary and secondary windings the coupling factor is greatly reduced resulting in inefficiencies within the transformer.

The presented transformers decrease resistance and improve Q compared to vertical transformers while eliminating and/or minimizing insertion losses due to a poor coupling factor compared to horizontal type transformers. In an example, a layer of a stacked-layer transformer may include a shared wire element that has side by side first and second wire sections. A coupled layer above the shared wire element includes a wire element that extends over the first wire section and partially over the second wire section to form a primary winding. As a result of the first wire element of the layer extending partially over the second wire section, the axis of the equivalent current flow of the primary winding shifts towards the center axis between the first wire section and the second wire section. Meanwhile, a coupled layer below the shared wire element has a wire element that extends under the second wire section and partially under the first wire section to form a secondary winding. As a result of the wire element extending partially under the first wire section, the axis of the equivalent current flow of the secondary winding also shifts toward the center axis between the first wire section and the second wire section. Additionally, the layer with the shared wire element may be formed of a low-ohm resistive metal during a single manufacturing step, reducing resistance in both the primary and the secondary windings, improving Q quality, while minimizing the distance between the equivalent current paths to minimize insertion losses.

In another example, the primary winding may be formed of first and second side-by-side parallel spaced wire sections similar to the shared layer of the previous example. In this example, the secondary winding is placed between the first and second spaced wire sections. These primary and secondary windings may then be connected by via at a bridge element. As a result of the secondary winding being placed in between the first and second wire sections, the equivalent current path of the primary winding is identical to the current path of the secondary winding such that no distance exists between the current paths identical to a vertical winding transformer. Therefore, the mutual coupling factor is maximized and insertion loss minimized while presenting a layer having both the primary and the secondary windings. Consequently, the layer may be manufactured in a single manufacturing step with low resistive metal to maximize Q.

FIG. 1 illustrates an exemplary user device according to some aspects that may utilize the disclosed transformers in some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real time clock (RTC), timer-counters including interval and watchdog timers, general purpose IO, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband sub-system 110 and RFEM 115 in a mmWave system is shown in FIG. 1A.

Figure 1A:
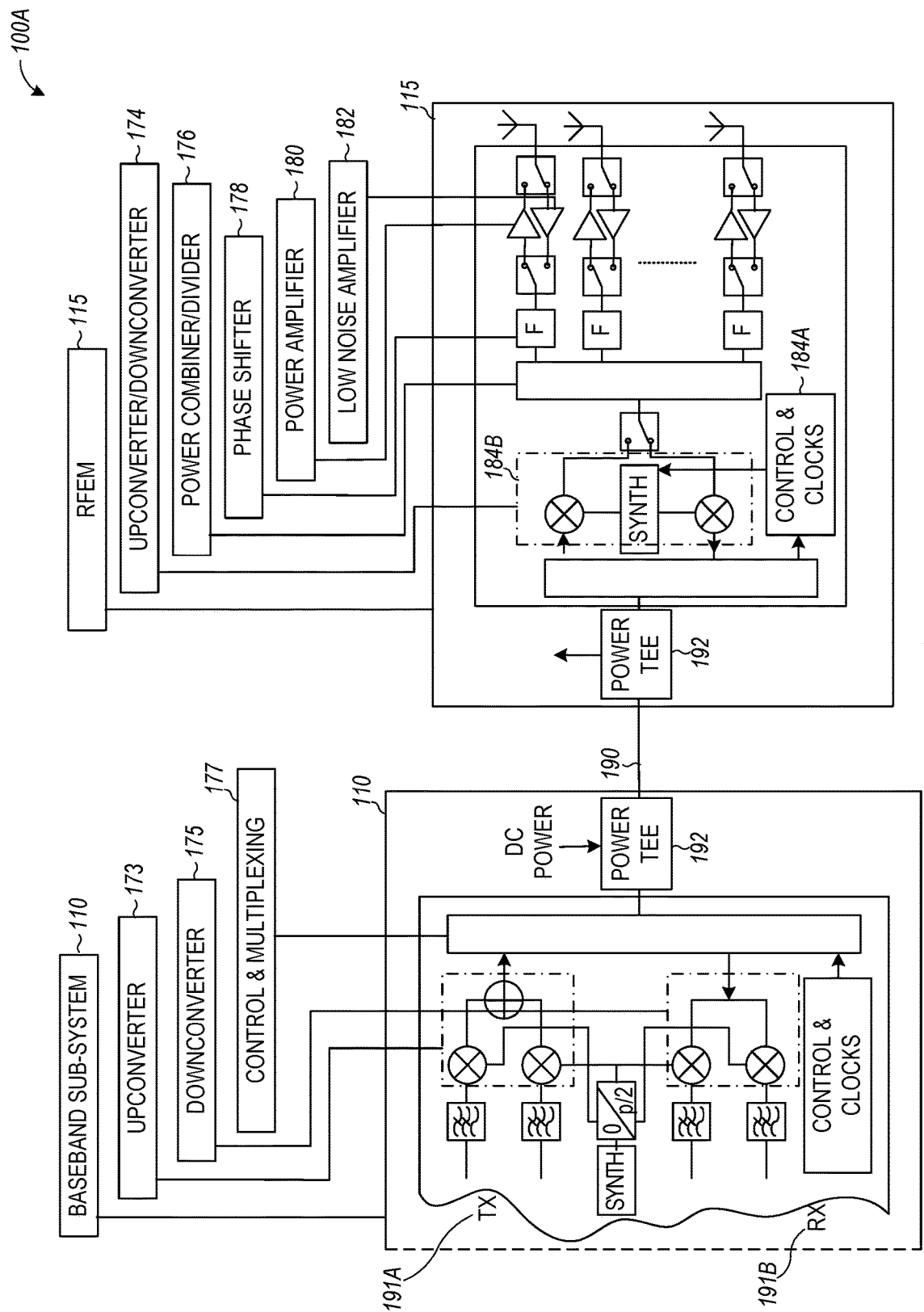
FIG. 1A illustrates a millimeter wave (mm Wave) system, which can be used in connection with the device of FIG. 1 according to some exemplary aspects of this disclosure.

FIG. 1A illustrates a mmWave system 100A, which can be used in connection with the device 100 of FIG. 1 according to some aspects of the present disclosure. The system 100A includes two sections: a baseband sub-system 110 and one or more radio front end modules (RFEMs) 115. The RFEM 115 can be connected to the baseband sub-system 110 by a single coaxial cable 190, which supplies a modulated intermediate frequency (IF) signal, DC power, clocking signals and control signals.

The baseband sub-system 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete sections) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2A:
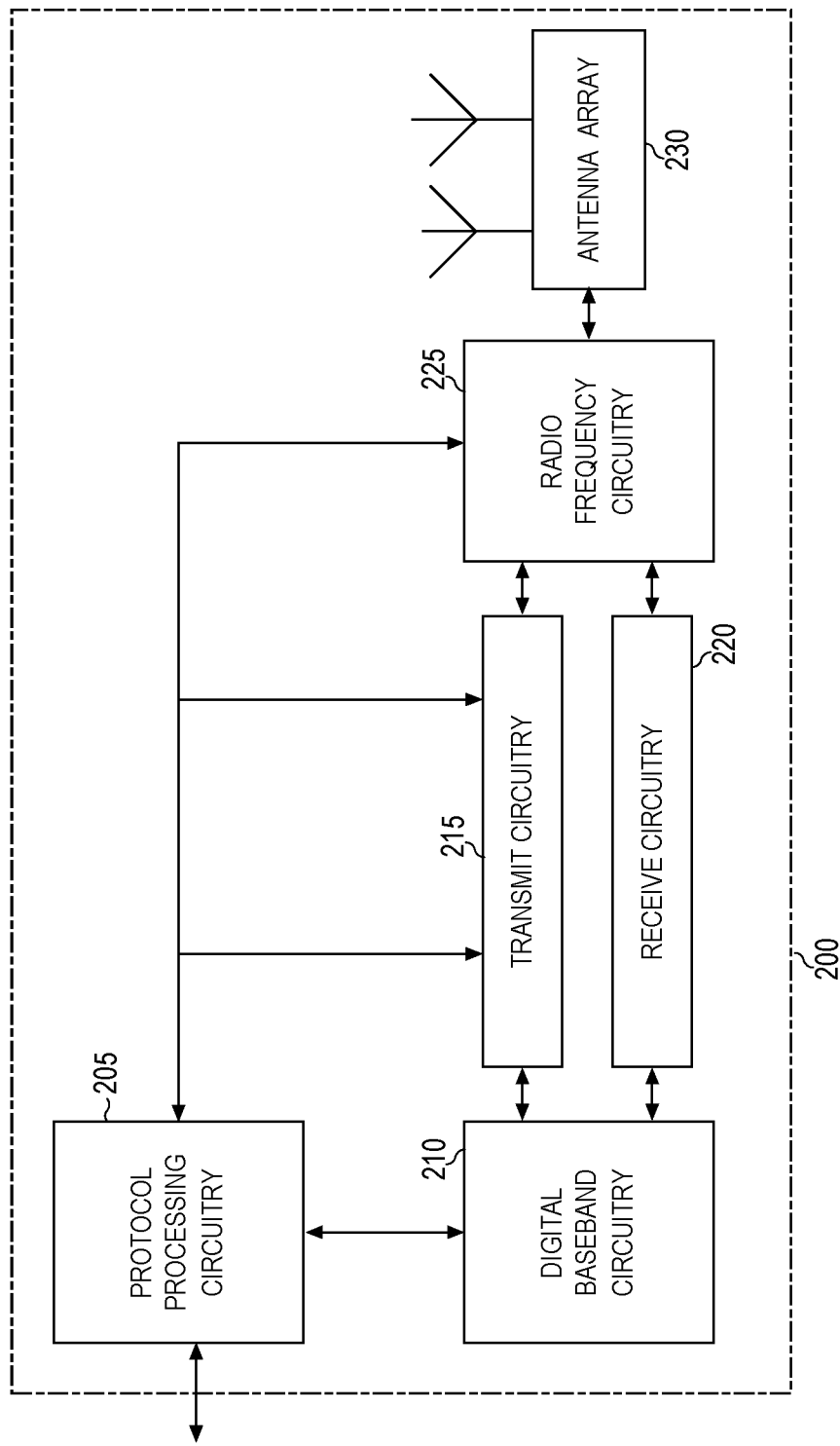
FIG. 2A illustrates exemplary millimeter wave communication circuitry according to some aspects.
Figure 2B:
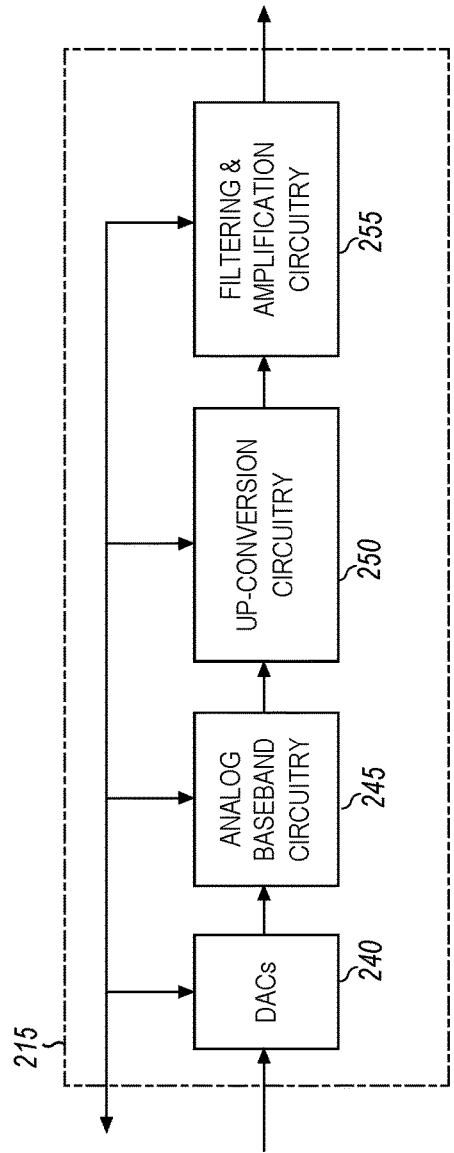
FIG. 2B illustrates aspects of exemplary transmit circuitry illustrated in FIG. 2A according to some aspects.
Figure 2C:
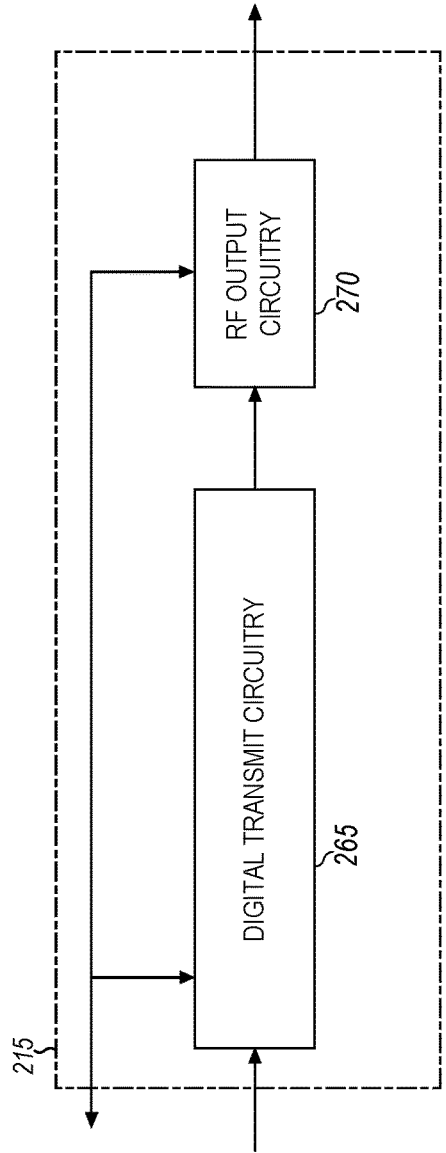
FIG. 2C illustrates aspects of exemplary transmit circuitry illustrated in FIG. 2A according to some aspects.
Figure 2E:
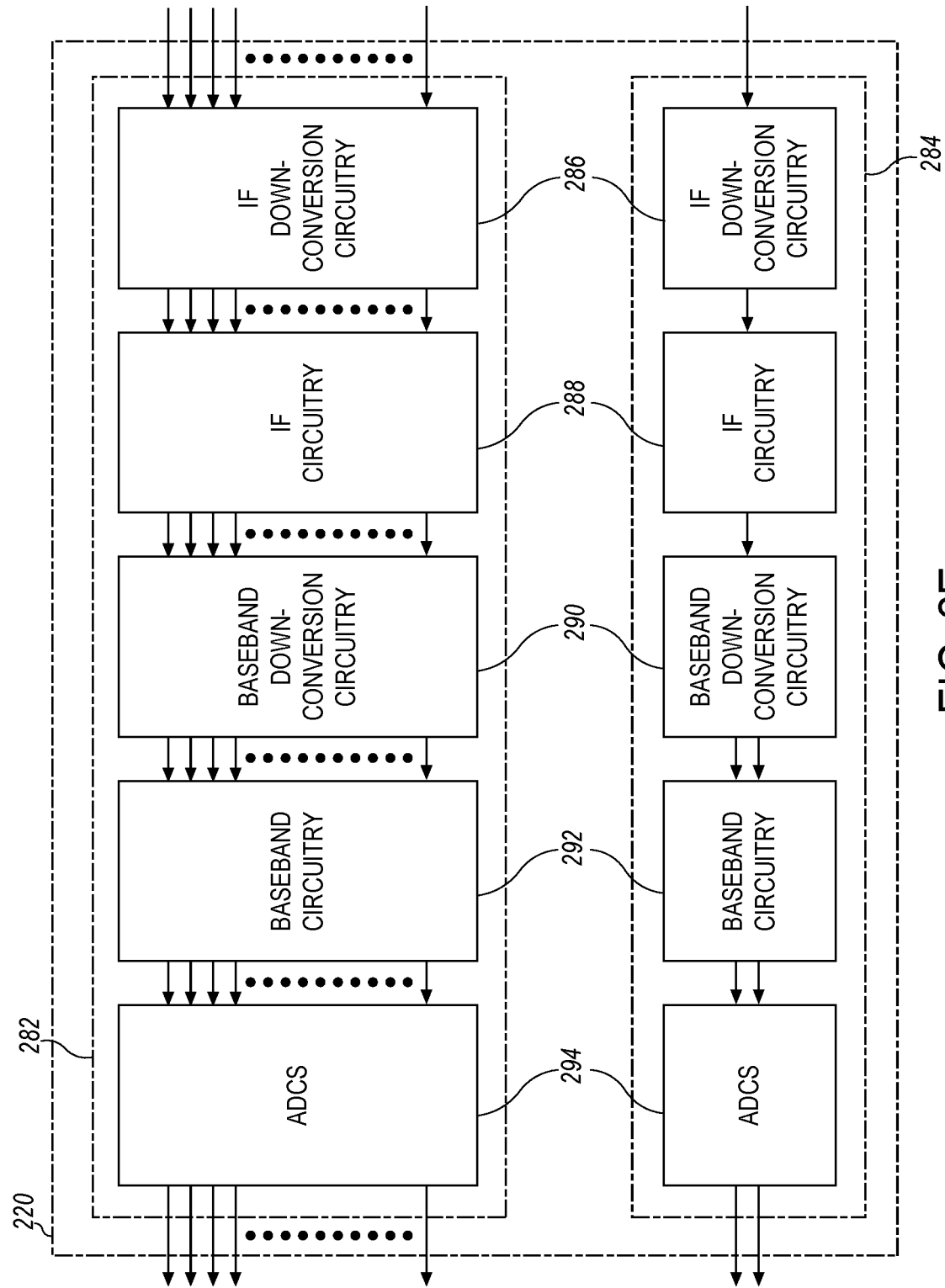
FIG. 2E illustrates aspects of exemplary receive circuitry in FIG. 2A according to some aspects.

FIG. 2A illustrates exemplary mmWave communication circuitry according to some aspects that may utilize the disclosed transformers according to some aspects; FIGS. 2B and 2C illustrate aspects of transmit circuitry shown in FIG. 2A according to some aspects; FIG. 2D illustrates aspects of radio frequency circuitry shown in FIG. 2A according to some aspects; FIG. 2E illustrates aspects of receive circuitry in FIG. 2A according to some aspects. Millimeter wave communication circuitry 200 shown in FIG. 2A may be alternatively grouped according to functions. Components illustrated in FIG. 2A are provided here for illustrative purposes and may include other components not shown in FIG. 2A.

Millimeter wave communication circuitry 200 may include protocol processing circuitry 205 (or processor) or other means for processing. Protocol processing circuitry 205 may implement one or more of medium access control (MAC), radio link control (RLC), packet data convergence protocol (PDCP), radio resource control (RRC) and non-access stratum (NAS) functions, among others. Protocol processing circuitry 205 may include one or more processing cores to execute instructions and one or more memory structures to store program and data information.

Millimeter wave communication circuitry 200 may further include digital baseband circuitry 210. Digital baseband circuitry 210 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 200 may further include transmit circuitry 215, receive circuitry 220 and/or antenna array circuitry 230. Millimeter wave communication circuitry 200 may further include RF circuitry 225. In some aspects, RF circuitry 225 may include one or multiple parallel RF chains for transmission and/or reception. Each of the RF chains may be connected to one or more antennas of antenna array circuitry 230.

In some aspects, protocol processing circuitry 205 may include one or more instances of control circuitry. The control circuitry may provide control functions for one or more of digital baseband circuitry 210, transmit circuitry 215, receive circuitry 220, and/or RF circuitry 225.

FIGS. 2B and 2C illustrate aspects of transmit circuitry shown in FIG. 2A according to some aspects. Transmit circuitry 215 shown in FIG. 2B may include one or more of digital to analog converters (DACs) 240, analog baseband circuitry 245, up-conversion circuitry 250 and/or filtering and amplification circuitry 255. DACs 240 may convert digital signals into analog signals. Analog baseband circuitry 245 may perform multiple functions as indicated below. Up-conversion circuitry 250 may up-convert baseband signals from analog baseband circuitry 245 to RF frequencies (e.g., mmWave frequencies). Filtering and amplification circuitry 255 may filter and amplify analog signals. Control signals may be supplied between protocol processing circuitry 205 and one or more of DACs 240, analog baseband circuitry 245, up-conversion circuitry 250 and/or filtering and amplification circuitry 255.

Transmit circuitry 215 shown in FIG. 2C may include digital transmit circuitry 265 and RF circuitry 270. In some aspects, signals from filtering and amplification circuitry 255 may be provided to digital transmit circuitry 265. As above, control signals may be supplied between protocol processing circuitry 205 and one or more of digital transmit circuitry 265 and RF circuitry 270.

FIG. 2D illustrates aspects of radio frequency circuitry shown in FIG. 2A according to some aspects. Radio frequency circuitry 225 may include one or more instances of radio chain circuitry 272, which in some aspects may include one or more filters, power amplifiers, low noise amplifiers, programmable phase shifters and power supplies.

Radio frequency circuitry 225 may also in some aspects include power combining and dividing circuitry 274. In some aspects, power combining and dividing circuitry 274 may operate bidirectionally, such that the same physical circuitry may be configured to operate as a power divider when the device is transmitting, and as a power combiner when the device is receiving. In some aspects, power combining and dividing circuitry 274 may include one or more wholly or partially separate circuitries to perform power dividing when the device is transmitting and power combining when the device is receiving. In some aspects, power combining and dividing circuitry 274 may include passive circuitry including one or more two-way power divider/combiners arranged in a tree. In some aspects, power combining and dividing circuitry 274 may include active circuitry including amplifier circuits.

In some aspects, radio frequency circuitry 225 may connect to transmit circuitry 215 and receive circuitry 220 in FIG. 2A. Radio frequency circuitry 225 may connect to transmit circuitry 215 and receive circuitry 220 via one or more radio chain interfaces 276 and/or a combined radio chain interface 278. In some aspects, one or more radio chain interfaces 276 may provide one or more interfaces to one or more receive or transmit signals, each associated with a single antenna structure. In some aspects, the combined radio chain interface 278 may provide a single interface to one or more receive or transmit signals, each associated with a group of antenna structures.

FIG. 2E illustrates aspects of receive circuitry in FIG. 2A according to some aspects. Receive circuitry 220 may include one or more of parallel receive circuitry 282 and/or one or more of combined receive circuitry 284. In some aspects, the one or more parallel receive circuitry 282 and one or more combined receive circuitry 284 may include one or more Intermediate Frequency (IF) down-conversion circuitry 286, IF processing circuitry 288, baseband down-conversion circuitry 290, baseband processing circuitry 292 and analog-to-digital converter (ADC) circuitry 294. As used herein, the term "intermediate frequency" refers to a frequency to which a carrier frequency (or a frequency signal) is shifted as in intermediate step in transmission, reception, and/or signal processing. IF down-conversion circuitry 286 may convert received RF signals to IF. IF processing circuitry 288 may process the IF signals, e.g., via filtering and amplification. Baseband down-conversion circuitry 290 may convert the signals from IF processing circuitry 288 to baseband. Baseband processing circuitry 292 may process the baseband signals, e.g., via filtering and amplification. ADC circuitry 294 may convert the processed analog baseband signals to digital signals.

Figure 3:
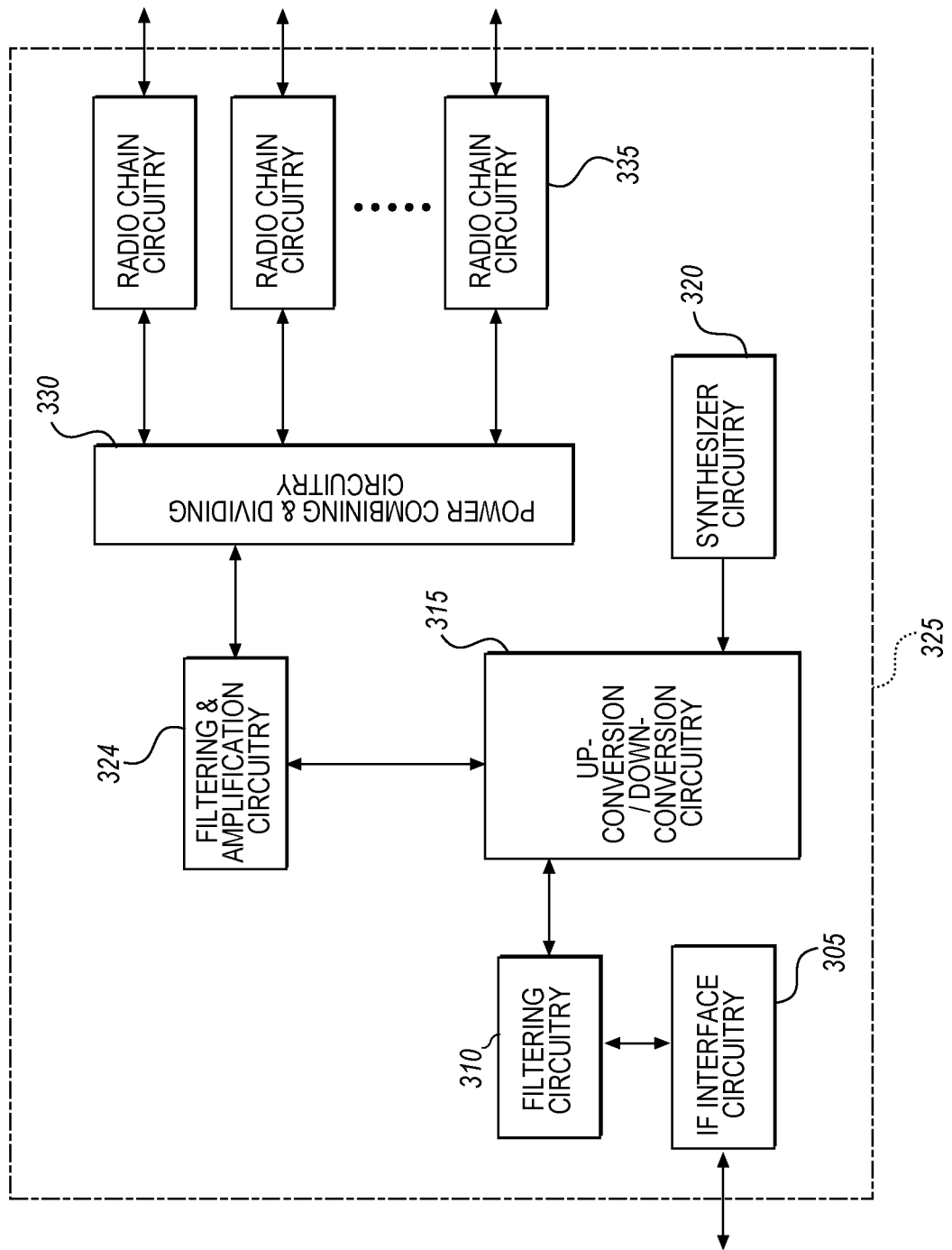
FIG. 3 illustrates exemplary usable RF circuitry in FIG. 2A according to some aspects.

FIG. 3 illustrates exemplary RF circuitry of FIG. 2A according to some aspects that may utilize the disclosed transformers. In an aspect, RF circuitry 225 in FIG. 2A (depicted in FIG. 3 using reference number 325) may include one or more of the IF interface circuitry 305, filtering circuitry 310, up-conversion and down-conversion circuitry 315, synthesizer circuitry 320, filtering and amplification circuitry 324, power combining and dividing circuitry 330, and radio chain circuitry 335.

Figure 4:
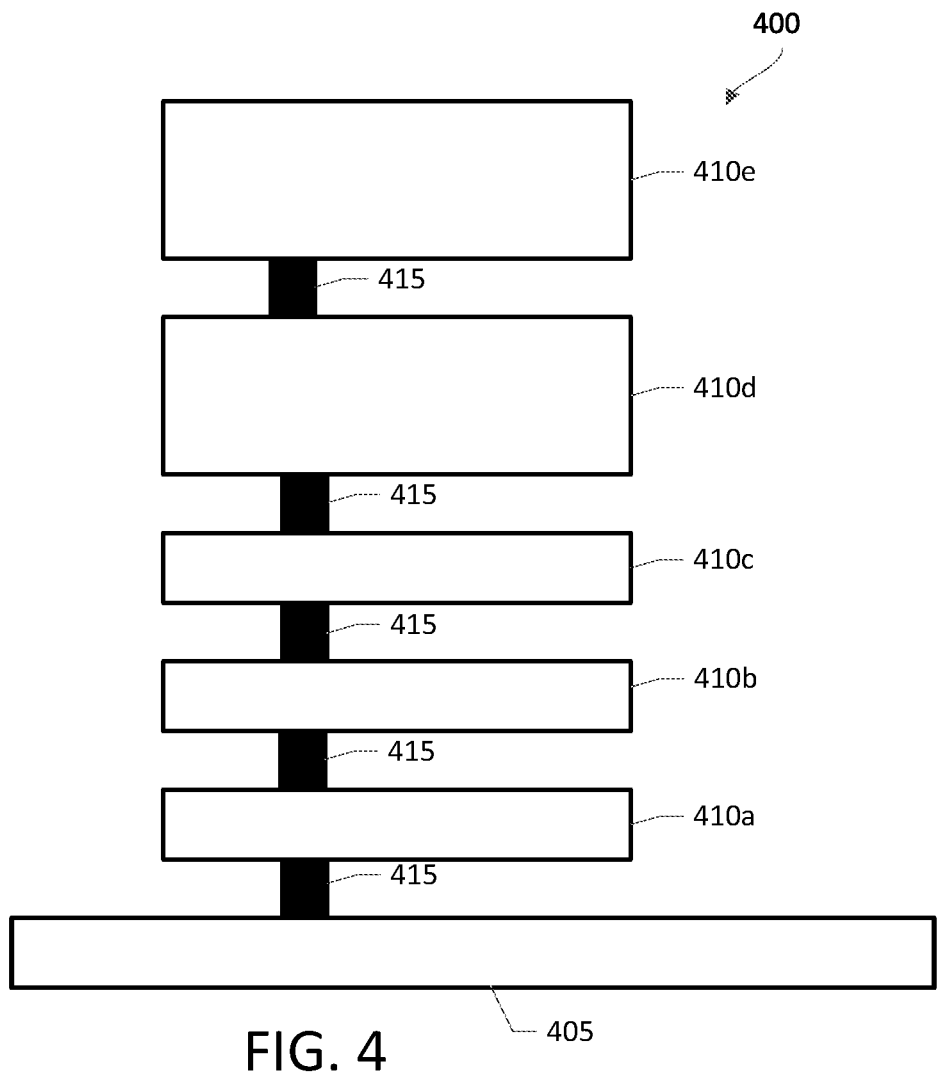
FIG. 4 is a schematic diagram of an inductance apparatus according to some aspects.

FIG. 4 illustrates a schematic representation of a stacked multi-layer inductance apparatus 400. The inductance apparatus in one example is a transformer while in another example is an inductor. The inductance apparatus 400 includes a substrate 405 that in an aspect is a sheet of silicon. In an aspect, the apparatus 400 is an integrated on chip transformer, inductor, or the like. The substrate 405 receives layers 410a-410e that are electrically and mechanically connected to one another by interconnection elements 415. In one aspect each interconnection element 415 is a via. Specifically, the lowermost layer 410a is coupled to the substrate with via elements and each successive layer 410a-410e is similarly connected to another layer by via elements.

In some aspects, each layer 410a-410e is made of a metal material. In an aspect, each layer is made of copper. In another aspect, the uppermost layer is made from aluminum while the other layers are made from copper. In yet another aspect, at least one layer is made from a copper material having a resistivity that is lower than the resistivity of the other layers. In another aspect, the at least one layer is made from a copper material having a resistivity of between 0.01 ohms per square micrometers and 0.001 ohms per square micrometers. In yet another aspect, the at least one layer is formed in a single manufacturing operation.

While only five layers 410a-410e are illustrated in FIG. 4, FIG. 4 is only illustrative as an example and more or less layers may be present in an inductance apparatus 400. In addition, each layer may comprise a single wire element, multiple wire elements, multiple wire sections, a single primary winding, a single secondary winding or the like. Each layer 410a-410e is electrically coupled to a current source that provides current to a primary winding.

Figure 5:
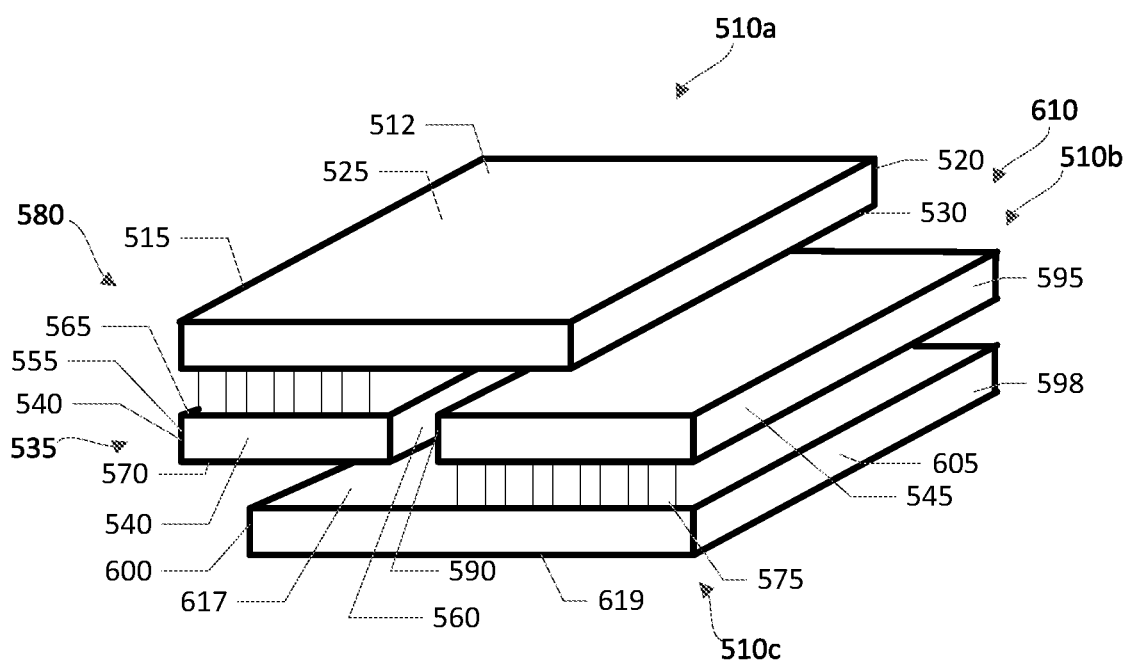
FIG. 5 is a schematic diagram of stacked layers of a transformer according to some aspects.

FIG. 5 illustrates a schematic representation of three stacked layers 510a-510c of a transformer to illustrate the interconnection between layers 510a-510c of the transformer. The stacked layers 510a-510c may be any three consecutive layers of the apparatus 400. In an aspect, the stacked layers 510a-510c represent the topmost three layers 410c-410e of the transformer of FIG. 4. In another aspect, the stacked layers 510a-510c represent the topmost three layers of an eight layer transformer.

Topmost layer 510a, or the first layer, is a wire element 512 that extends from a first edge 515 to a second edge 520 and includes a top surface 525 and a bottom surface 530. Example wire elements and sections described herein include, but are not limited to traces, elongated materials with a circular cross section, elongated materials with a rectangular cross section, elongated materials with a uniform cross section, elongated materials with irregular cross sections, and the like. In an aspect, the top surface 525 is the topmost surface of the transformer. In another aspect, the top surface 525 interconnects with another layer. In another aspect, the topmost layer is made of aluminum.

The middle layer, or second layer, is a shared wire element 535 that includes a first wire section 540 and a second wire section 545 in parallel spaced relation having a center axis 550 therebetween. The first wire section 540 extends from a first edge 555, which in an aspect aligns with the first edge 515 of the topmost layer 510a, to a second edge 560 that is underneath the topmost layer 510a. In another aspect, the first edge 555 of the first wire section is offset from the first edge 515 of the topmost layer 510a. Because the wire element 512 of the topmost layer 510a extends beyond the second edge 560 of the first wire section 540, the equivalent current axis 585 of the primary turn winding 580 is located closer to the center axis 550 between the first and second wire sections 540 and 545 than if the wire element 512 of the topmost layer 510a had the same width as the first wire section 540.

The second wire section 545 of the shared wire element 535 extends from a first edge 590 to a second edge 595. The wire element 512 of the topmost layer 510a extends above the second wire section 545 beyond the first edge 590, but not to the second edge 595 of the second wire section 545. In this manner the wire element 512 of the topmost layer 510 completely overlaps the first wire section 540 and partially overlaps the second wire section 545.

The shared wire element 535 also has a top surface 565 and a bottom surface 570. In an aspect, the top surface of the first wire element 535 interconnects with the topmost layer 510a through at least one via element 575 to form a primary winding 580.

The bottommost layer 510c, or third layer, is a wire element 598 that extends from a first edge 600 to a second edge 605. In an aspect, the second edge 605 aligns with the second edge 595 of the second wire section 545. In another aspect, the second edge 605 of the bottommost layer 510c is offset from the second edge 595 of the second wire section 545. The first edge 600 of the wire element 598 of the bottommost layer 510c extends past the first edge 590 of the second wire section 545 and past the second edge 560 of the first wire section 540 such that the wire element 598 of the bottommost layer 510c completely overlaps the second wire section 545 and only partially overlaps with the first wire section 540. The wire element 598 of the bottommost layer 510c interconnects with the bottom surface 570 of the second wire section 545 with at least one via element 575 to form a secondary turn winding 610. While described as primary and secondary windings in these aspects, in other aspects the primary winding 580 may be a secondary winding and the secondary winding 610 may be a primary winding. Because the wire element 598 of the bottommost layer 510c extends past the first edge 590 of the second wire section 545, the equivalent current axis 615 of the second winding 610 is located closer to the center axis 550 between the first and second wire sections 540 and 545 than if the bottommost layer 510c were the same width as the second wire section 545. Thus, by having the wire element 512 of the topmost layer 510a partially overlap with the second wire section 545 and by having the wire element 598 of the bottommost layer 510c partially overlap with the first wire section 540 the equivalent current axis 585 of the first, or primary winding 580 is moved closer to the equivalent current axis 615 of the second, or secondary winding 610. In this regard, the distance between the primary and the secondary winding can be reduced, providing better mutual coupling factor (k) compared to a typical horizontal transformer arrangements.

The wire element 598 of the bottommost layer 510c also includes a top surface 617 and a bottom surface 619. In an aspect, the bottom surface 605 interconnects with another layer. In another aspect, the bottom surface interconnects with a substrate.

Figure 6:
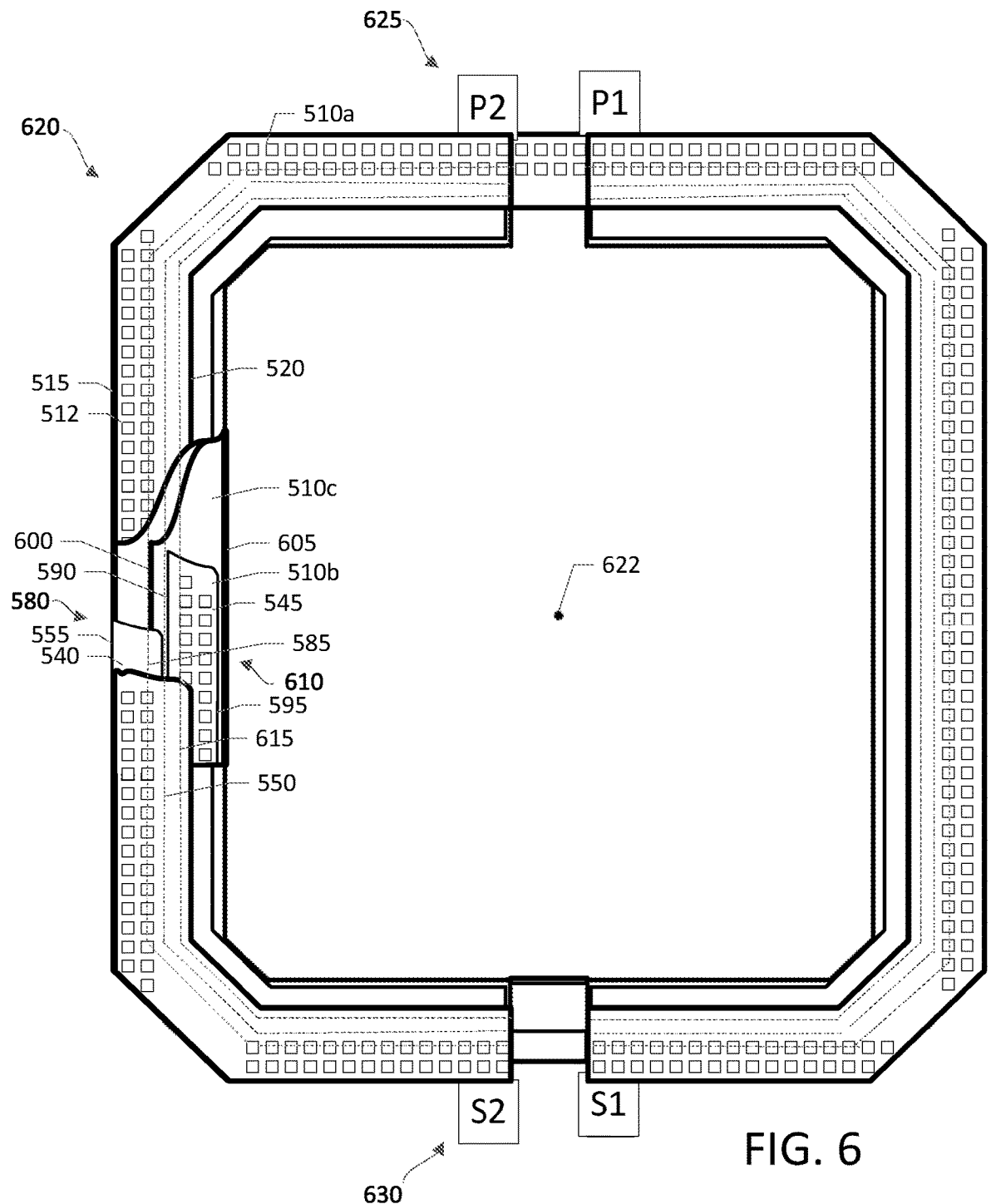
FIG. 6 is a top plan cutaway view of a transformer according to some aspects.

FIG. 6 illustrates a top view with a cut away of a transformer 620 illustrating the three layers 510a-510c. The transformer 620 in one aspect is the inductance apparatus 400 of FIG. 4. Each of the layers 510a-510c extends around a center axis 622 of transformer 620 and has primary connectors 625 and secondary connectors 630. As illustrated in FIG. 6, the wire element 598 of the bottommost layer 510c extends past the first edge 590 of the second wire section 545 and partially under the first wire section 540. The wire element 512 of the topmost layer 510a meanwhile extends over the first wire section 540, also past the first edge 590 of the second wire section 545, and partially over the second wire section 545 to minimize distance between the equivalent current axis 585 of the primary winding 580 and the equivalent current axis 615 of the secondary winding 610. In this regard, mutual coupling factor (k) can be increased in comparison to a horizontal arrangement, while mutual capacitance between the first and second windings can be reduced in comparison to a vertical winding arrangement. Therefore, resonance frequency is also minimized.

Additionally, the shared wire element 535 can be located in a single plane allowing, in one aspect, for forming or applying the first wire section 540 and second wire section 545 in a single manufacturing step that presents a metal material with less resistance than other layers. In an aspect, the metal has a resistance ranging between 0.01 ohms per square micrometers and 0.001 ohms per square micrometers. Thus, each of the first and second windings 580 and 610 of the example transformer 620 includes a metal with less resistance than the resistance of other metal layers, improving resistance properties and quality factor (Q) compared to a vertical winding transistor. Specifically, $R_{pri}=\rho_{AP}/(W_{AP}*d_{AP})//\rho_7/(w_7*d_7)$; $R_{sec}=\rho_{AP}/(w_{AP}*d_{AP})//\rho_7/(w_7*d_7)$, where $R_{pri}$ is the resistance of the primary winding in ohms per micrometers, $\rho_{AP}$ is the resistivity of the wire material of the topmost layer in ohm per square macrometers, $w_{AP}$ is the width from the first edge 515 of the wire element 512 of the topmost layer to the second edge 520 of the wire element 512 of the topmost layer in micrometers; $d_{AP}$ is the height of the wire element 512 of the topmost layer from top surface 525 to the bottom surface 530 in micrometers, $\rho_7$ is the resistivity of the wire material of the shared wire element 535 in ohm per square macrometers, $w_{7A}$ is the width from the first edge 555 of the first wire section 540 to the second edge 560 of the first wire section 540 in micrometers, $d_7$ is the height of the shared wire element 535 from the top surface 565 to the bottom surface 570 in micrometers, $R_{sec}$ is the resistance of the secondary winding in ohms per micrometers, $w_{7B}$ is the width from the first edge 590 of the second wire section 545 to the second edge 595 of the second wire section 545 in micrometers, $\rho_6$ is the resistivity of the wire material of the wire element 598 of the bottommost layer in ohm per square macrometers, $w_6$ is the width from the first edge 600 of the wire element 598 of the bottommost layer to the second edge 605 of the wire element 598 of the bottommost layer in micrometers, and $d_6$ is the height of the wire element 598 bottommost layer from top surface 617 to the bottom surface 619 in micrometers.

Figure 7:
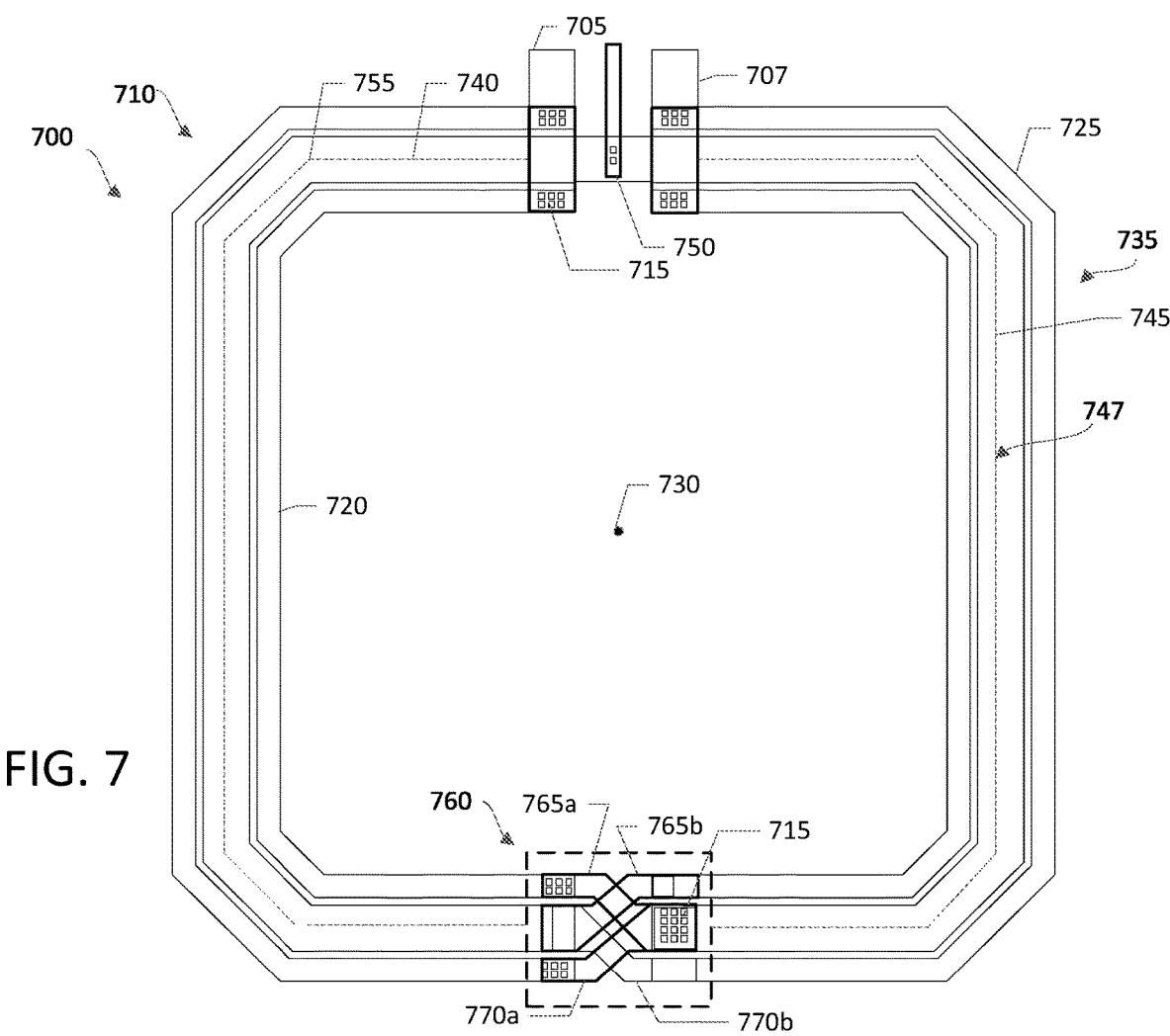
FIG. 7 is a schematic diagram of layers of an inductor according to some aspects.

FIG. 7 illustrates an example inductor 700. This inductor includes a plus node 705 and a minus node 707 interconnected to a primary winding, first winding, or wire element, 710 by at least one interconnection element 715. In one aspect, the interconnection device 715 is a via.

The primary winding 710 includes a first wire section 720 and a second wire section 725 that extend in parallel, side-by-side relation around a center axis 730 to form a second turn 735. Because the first wire section 720 and the second wire section 725 are in parallel spaced relation, an equivalent current axis 740 is disposed between the sections 720 and 725. The primary winding 710, in one aspect, is interconnected to a substrate such as the substrate of FIG. 4. In another aspect, the primary winding 710 is interconnected to a layer of and is on a layer of a stacked multi-layered inductor. In one aspect, the stacked multi-layer inductor has at least nine layers that are stacked on a substrate.

A secondary winding, second winding, or wire element, 745 is interconnected to a center tap 750 by at least one interconnection element 715. In one aspect, the interconnection element 715 is a via element. The center tap 750 is disposed between the plus node 705 and minus node 707 and functions as an AC ground.

The secondary winding 745 extends around the center axis 730 between the first wire section 720 and the second wire section 725 of the primary winding 710 to form a first turn 747. The secondary winding 745 is an equidistance from the first wire section 720 and the second wire section 725, such that the current axis 755 of the secondary winding 745 aligns with the equivalent current axis 740 of the primary winding 710. The secondary winding 745 also extends in the same plane as the primary winding 710, allowing for both the primary winding 710 and secondary winding 745 to be applied in the same manufacturing step with the same metallic material. In one aspect, the metallic material has a resistivity of between 0.01 ohms per square micrometers and 0.001 ohms per square micrometers.

A bridge element 760 connects the first winding 710 with the second winding 745 with interconnection elements 715 such as vias. At the bridge element 760, the second winding 745 forks or branches into first wire sections 765a, 765b and second wire sections 770a, 770b. The first wire sections 765a and/or 765b extend to, and either over or under, the first wire section 720 of the primary winding 710. Specifically, the first wire sections 765a and/or 765b extend to a different plane than the first wire section 720 of the primary winding 710. Once either above or below the first wire section 720 of the primary winding 710, the first wire section 720 of the primary winding 710 is interconnected with the first wire sections 765a and/or 765b of the secondary winding 745 with at least one interconnection element 715 such as a via.

Similarly, the second wire sections 770a and/or 770b of the secondary winding 745 extend to, and either over or under, the second wire section 725 of the primary winding 710. Specifically, the second wire sections 770a and/or 770b extend to a different plane than the second wire section 725 of the primary winding 710. Once either above or below the second wire section 725 of the primary winding 710, the second wire section 725 of the primary winding 710 is interconnected with the second wire sections 770a and/or 770b of the secondary winding 745 with at least one interconnection element 715 such as a via.

As a result of this arrangement the effective magnetic flux area looping by the second turn 735 is the same as that of the first turn 747 maximizing the mutual coupling factor (k) and consequently maximizing both inductance and Q quality factor between the first and second turns. Specifically:

$$Q=\omega L/R$$

$$L=L1+L2+2k(L1*L2)^{1/2}$$

$$k \approx 0.9 - ds/davg,$$

where quality factor Q does not have units, $\omega$ is operating frequency, R is the resistance of a winding measured in ohms, L is the total inductance measured in Henrys, L1 and L2 are the inductance of the first turn and second turn, k is the mutual coupling factor of the first turn and second turn, ds is the center to center distance of the current traces between first and second turns, and davg is the average center to center distance.

In the example inductor 700 illustrated in FIG. 7, because the effective magnetic flux area looping by the second turn 735 is the same as that of the first turn 747, L1=L2 and the center-to-center distance of the current traces is zero. Consequently:

$$L=2L1(1+k)$$

$$k \approx 0.9$$

In this regard, the mutual coupling factor can be maximized, increasing total inductance. Additionally, because the first or primary winding 710 and the second or secondary winding 745 are on the same plane, a CMOS application of metallic material in traces having a resistivity of between 0.01 ohms per square micrometers and 0.001 ohms per square micrometers is applied. Therefore, only portions of the bridge element 760 not lying in the same plane as the primary and secondary windings 710 and 755 have metal of greater resistance to that applied during the CMOS process. Consequently, the resistance of the primary and the secondary windings 710 and 745 is minimized, maximizing Q.

Figure 8:
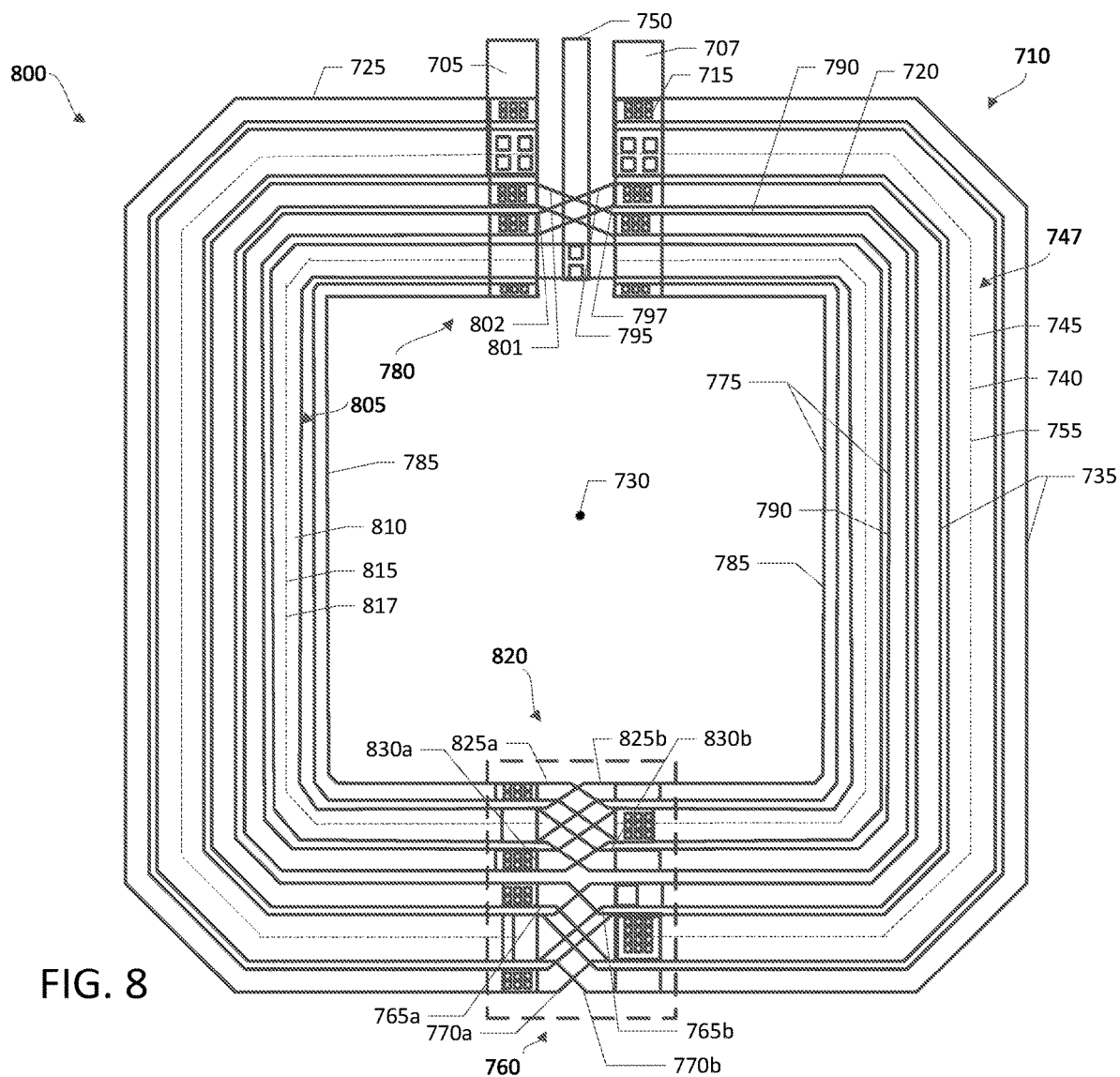
FIG. 8 is a schematic diagram of layers of an inductor according to some aspects.

FIG. 8 illustrates another example inductor 800 that is the example inductor 700 of FIG. 7 including additional turns. The second turn 735 of the transformer 800 of FIG. 8 is thus connected to the first turn 747 of the transformer 800 of FIG. 8 at bridge element 760 and connected to a third turn 775 at interconnecting bridge element 780 that, in an aspect, includes at least one via element.

The third turn 775 includes a first wire section 785 and a second wire section 790 that extend in parallel spaced relation around the center axis 730 of the inductor 700 inside of the first wire section 720 of the second turn 735. The first and second wire sections 785 and 790, in one aspect, are the same width and distance apart as the first and second wire sections 720 and 725 of the first turn. In another aspect, the first and second wire sections 785 and 790 are different widths and are spaced at different distances apart from one another.

The second wire section 790 of the third turn 775 interconnects with the first wire section 720 of the second turn 735 at the primary winding interconnecting bridge element 780. Specifically, adjacent the plus and minus nodes 705, 707 and the center tap 750, a first interconnecting wire element 795 extends from an end 797 of the first wire section 720 of the second turn 735 adjacent the minus node diagonally to the second wire section 790 of the third turn 775. Similarly, a second interconnecting wire element 801 extends from an end 802 of the first wire section 720 of the second turn 735 adjacent the plus node 705 diagonally to the second wire section 790 of the third turn 775. In this manner, the first interconnecting wire element 795 and second interconnecting wire element 801 cross and overlap one another at the primary winding interconnecting bridge element 780.

A fourth turn 805 includes a winding, or wire element, 810 that is interconnected to the center tap 750 by at least one interconnection element 715. In one aspect, the interconnection element 715 is a via element.

The fourth turn winding 810 extends around the center axis 730 between the first wire section 785 and the second wire section 790 of the third turn 775. The winding 810 is an equidistance from the first wire section 785 and the second wire section 790, such that the current axis 815 of the fourth turn winding 810 aligns with the equivalent current axis 817 of the third turn winding 775. The winding 810 of the fourth turn 805 also extends in the same plane as the first, second and third turns 747, 735, and 775, respectively, allowing for all of the turns 747, 735, 775, and 805 to be applied in the same manufacturing step and with the same metallic material. In one aspect, the metallic material has a resistivity of between 0.01 ohms per square micrometers and 0.001 ohms per square micrometers.

A bridge element 820 adjacent to bridge element 760 connects the third turn 775 with the fourth turn 805 with interconnection elements 715 such as via. At the bridge element 820, the fourth turn winding 810 forks or branches into first wire sections 825a, 825b and second wire sections 830a, 830b. The first wire sections 825a and/or 825b extend to, and either over or under, the first wire section 785 of the third turn 775. Specifically, the first wire sections 825a and/or 825b of the fourth turn 805 extend to a different plane than the first wire section 785 of the third turn 775. Once either above or below the first wire section 785 of the third turn 775, the first wire sections 825a and/or 825b of the fourth turn 805 are interconnected with the first wire section 785 of the third turn 775 with at least one interconnection element 715 such as a via.

Similarly, the second wire sections 830a and/or 830b of the fourth turn 805 extend to and either over or under the second wire section 790 of the third turn 775. Specifically, the second wire sections 830a and/or 830b of the fourth turn 805 extend to a different plane than the second wire section 790 of the third turn 775. Once either above or below the second wire section 790 of the third turn 775, the second wire section 830a and/or 830b of the fourth turn 805 is interconnected with the second wire section 790 of the third turn 775 with at least one interconnection element 715 such as a via.

As a result of this arrangement, the effective magnetic flux area looping by the second turn 735 is the same as that of the first turn 747 while the effective magnetic flux area looping by the third turn 775 is the same as that of the fourth turn 805 maximizing the mutual coupling factor (k) and consequently maximizing both inductance and quality factor Q between the turns. Additionally, because the first, second, third, and fourth turns 747, 735, 775, and 805 are on the same plane, a CMOS application of metallic material in traces having a resistivity of between 0.01 ohms per square micrometers and 0.001 ohms per square micrometers is applied to all four turns. Therefore, the resistance of the each turn is minimized, also maximizing the quality factor Q.

Figure 9:
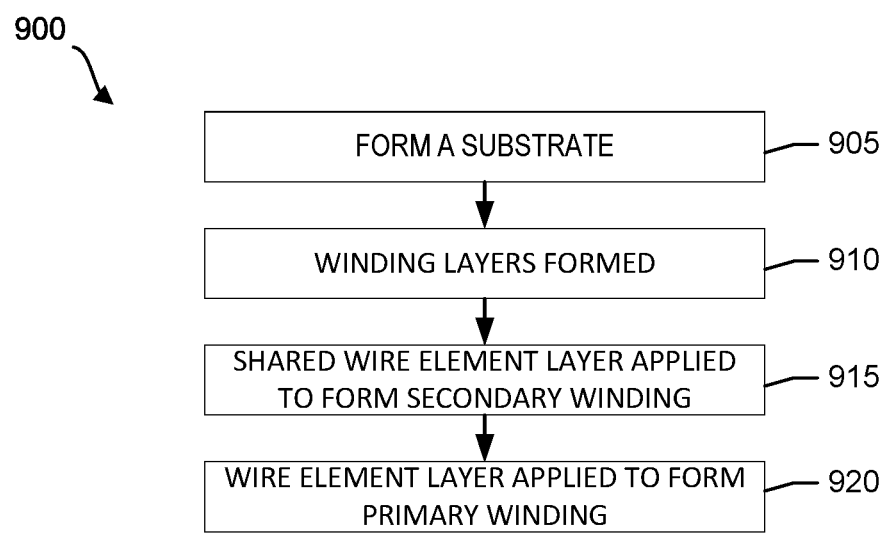
FIG. 9 is a block flow diagram of a method of manufacturing a transformer according to some aspects.

FIG. 9 illustrates a block flow diagram of a method 900 of manufacturing a transformer. In one aspect, the transformer is the transformer shown in example FIGS. 4-7. At 905, a substrate is formed of a desired size and shape for the transformer. At 910, winding layers are formed on the substrate. In one aspect, the layers are stacked vertically with a first layer interconnecting with the substrate, the second layer interconnected to and above the first layer, and each successive layer stacked on and interconnected with the previous layer. The number of layers can depend on the needed application and, in an aspect, at least nine layers are presented. Each layer includes wire elements that form primary windings and secondary windings. The wire elements include, but are not limited to metal traces, copper wire, aluminum wire, and the like.

At 915, a layer having a wire element with first and second parallel spaced wire sections is applied to a previously stacked layer to form a secondary winding. In an aspect, the first and second parallel spaced wire sections are applied as traces using a CMOS technique. Specifically, metallic material having a resistivity of between 0.01 ohms per square micrometers and 0.001 ohms per square micrometers is applied as two spaced apart wire sections extending around a center axis of the transformer. The first and second wire sections are positioned such that the second wire section is secured to at least one via to interconnect to the previously stacked layer and the second wire section is positioned such that the second wire section extends past the edge of the previously stacked layer, overlapping the previously stacked layer. In this manner, the first and second parallel spaced wire sections have a width greater than the width of the previously stacked layer.

At 920, a layer having a wire element interconnects with the first wire section to form a primary winding. The layer, in an aspect, is made of aluminum. In another aspect, the layer is the topmost layer of the transformer. The layer, similar to previous layers, can extend around the center axis of the transformer. In particular, the layer can be positioned to interconnect to the first wire section with at least one via and extends partially above the second wire section such that the second wire section extends past the edge of the layer. In this manner, the first and second parallel spaced wire sections have a width greater than the width of the layer.

Figure 10:
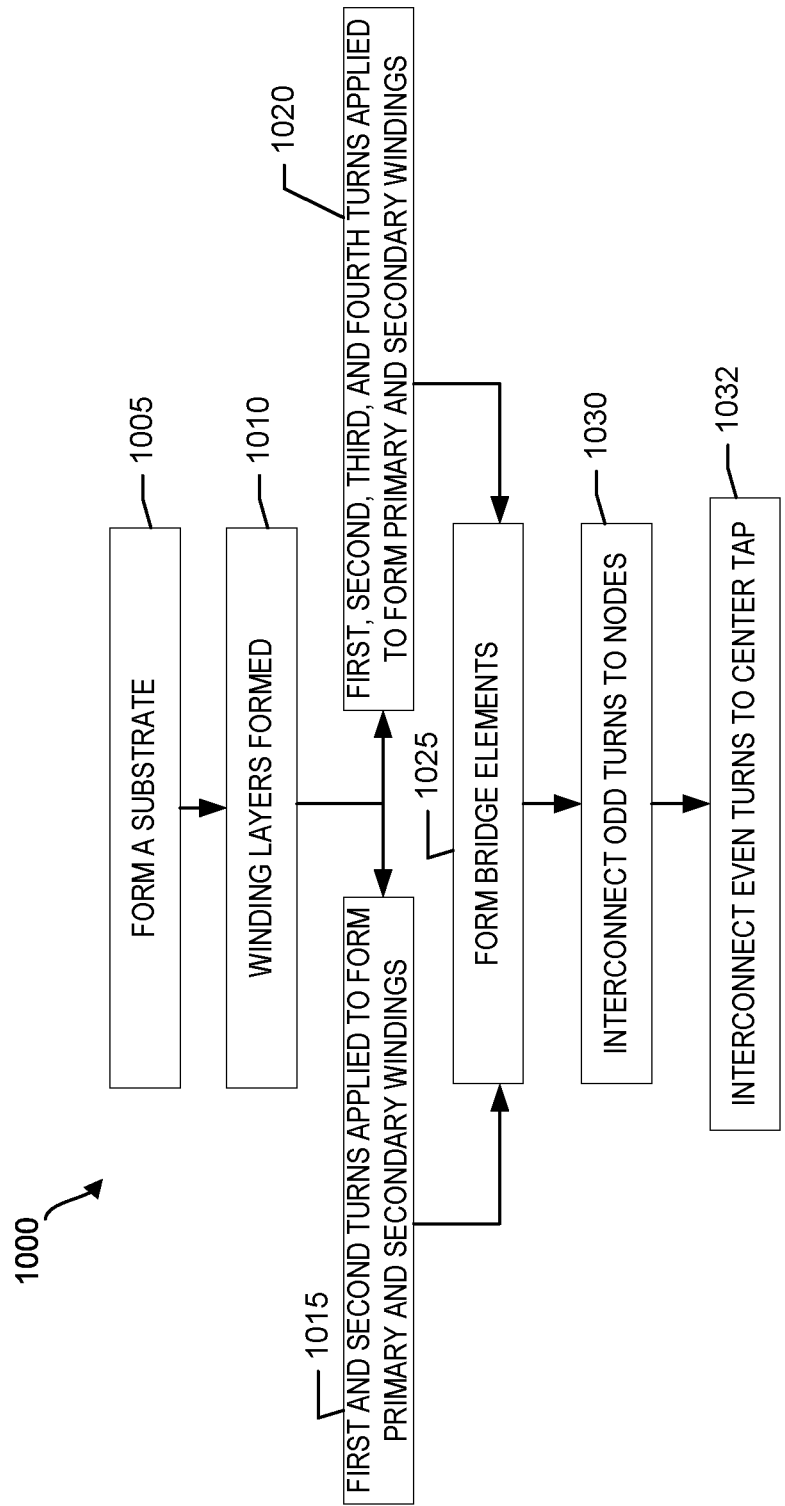
FIG. 10 is a block flow diagram of a method of manufacturing an inductor according to some aspects.

FIG. 10 illustrates an alternative block flow diagram of a method 1000 of manufacturing an inductor. In one aspect, the inductor is one of the example transformers shown in FIGS. 7-8. At 1005, a substrate is formed of a desired size and shape for the inductor. At 1010, winding layers are formed on the substrate. In one aspect, the layers are stacked vertically with a first layer interconnecting with the substrate, the second layer interconnected to and above the first layer, and each successive layer stacked on and interconnected with the previous layer. The number of layers depends on the application and, in an aspect, at least nine layers are presented. Each layer includes wire elements that form primary windings and secondary windings. The wire elements include, but are not limited to metal traces, copper wire, aluminum wire, and the like.

At 1015, first and second turns are applied to a previously stacked layer to form primary and secondary windings. The first and second turns are applied as traces using a CMOS technique. Specifically, metallic material having a resistivity of between 0.01 ohms per square micrometers and 0.001 ohms per square micrometers is applied as two spaced apart wire sections extending around a center axis of the inductor. The first turn includes a wire element that comprises first and second wire sections extending in parallel spaced relation around a center axis of the inductor from a plus node to a minus node. The second turn comprises a wire element that is positioned between the first and second wire sections and extends around the center axis of the inductor from the plus node to the minus node.

At 1020, alternatively, at least four turns are applied to a previously stacked layer to form primary and secondary windings. Each turn is applied as traces using a CMOS technique on the same plane. Specifically, metallic material is applied having a resistivity of between 0.01 ohms per square micrometers and 0.001 ohms per square micrometers. The odd turns include a wire element that comprises first and second wire sections extending in parallel spaced relation around a center axis of the inductor from a plus node to a minus node. The even turns comprise a wire element that is positioned between the first and second wire sections of the corresponding odd turn and extends around the center axis of the transformer from the plus node to the minus node. Each turn thus lies on the same plane.

At 1025, at least one bridge element is formed to interconnect turns. When only a first and second turn are presented at a position opposite the position of the plus and minus nodes, the first wire section of the first turn and the second wire section of the first turn extend toward one another in a converging manner and converge either above or below the second turn. The converged first turn then interconnects with the second turn with at least one via element. Meanwhile, the second turn, adjacent the converging first and second wire sections, forks into first and second wire sections of the second turn. The first and second wire sections of the second turn diverge and the first wire section of the second turn extends either under or over the first wire section of the first turn while the second wire section of the second turn extends either under or over the second wire section of the first turn. The respective first wire sections and second wire sections of each turn are then interconnected by at least one via element. Once all interconnections are made, the bridge element is formed. In the case of four turns or more, each odd turn and corresponding even turn form a bridge element in a similar manner such that there are half as many bridge elements as there are turns. Similarly, a bridge element is formed to connect the odd turns to one another.

At 1030, the odd turns are interconnected to the plus and minus nodes respectfully by at least one via elements. Similarly, at 1032, the even turns are interconnected to a center tap extending between the plus and minus nodes by at least one via element to complete the formation of the inductor. The center tap is thus used as a ground reference point for the inductor.

By utilizing the methodologies of FIGS. 9-10, a step of applying metal to a transformer or a inductor that has a resistivity of between 0.01 ohms per square micrometers and 0.001 ohms per square micrometers is accomplished in both the primary winding and secondary winding of the transformer. Thus resistance of the transformer or inductor is minimized increasing quality factor Q. Additionally, in both methods, the equivalent current axis of a first winding or turn is either aligned with the current axis of a second winding or turn, or the distance between the two is reduced compared to a horizontal transformer. In this manner the mutual coupling factor between windings and turns is also increased as compared to horizontal transformers. Additionally, these methodologies either horizontally separate or offset windings and turns, thus reducing mutual capacitance of the transformers compared to vertical transformers. Consequently, self-resonance frequency is similarly improved compared to vertical transformers resulting in improved transformers.

VARIOUS NOTES & ASPECTS

Example 1 is a stacked transformer apparatus comprising: a first layer including a first layer wire element extending around a center axis; a second layer including a second layer wire element comprising side by side first and second wire sections in parallel spaced relation extending around the center axis, wherein the first wire section is connected to the first layer wire element to form a primary turn winding; a third layer including a third layer wire element extending around the center axis and connected to the second wire section of the second layer wire element to form a secondary turn winding partially overlapping with the primary turn winding.

In Example 2, the subject matter of Example 1 optionally includes wherein the second wire section of the second layer wire element extends past an edge of the first layer wire element such that the first layer wire element partially overlaps with the second layer wire element to reduce capacitance between the primary turn winding and the secondary turn winding.

In Example 3, the subject matter of Example 2 optionally includes wherein the first wire section of the second layer extends past an edge of the third layer wire element such that the third layer wire element partially overlaps with the second layer wire element to reduce capacitance between the second layer and the third layer.

In Example 4, the subject matter of any one or more of Examples 1-3 optionally include ohms per square micrometers.

In Example 5, the subject matter of any one or more of Examples 1-4 optionally include wherein the first layer wire element comprises aluminum while the second layer wire element comprises copper.

In Example 6, the subject matter of any one or more of Examples 1-5 optionally include wherein the first layer, second layer, and third layer are stacked.

Example 7 is a transformer apparatus comprising: a primary turn winding comprising side by side first and second wire sections in parallel spaced relation extending around a center axis; a secondary turn winding extending between the first and second wire sections to align an equivalent current flow path of the primary turn winding with a current flow path of the secondary turn winding.

In Example 8, the subject matter of Example 7 optionally includes wherein the primary turn winding connects with the secondary turn winding at a bridge element.

In Example 9, the subject matter of Example 8 optionally includes wherein at the bridge element a vertically displaced via connects the primary turn winding to the secondary turn winding.

In Example 10, the subject matter of any one or more of Examples 7-9 optionally include wherein the secondary turn winding extends in the same plane as the primary turn winding.

In Example 11, the subject matter of any one or more of Examples 8-10 optionally include wherein the primary turn winding and secondary turn winding are made from a material having a resistance of less than a resistance of a material of the bridge element.

In Example 12, the subject matter of any one or more of Examples 7-11 optionally include wherein the first and second wire sections of the primary turn winding are metal traces.

In Example 13, the subject matter of any one or more of Examples 7-12 optionally include wherein the secondary turn winding is a metal trace.

In Example 14, the subject matter of any one or more of Examples 7-13 optionally include wherein the primary turn winding has at least two turns.

In Example 15, the subject matter of Example 14 optionally includes wherein the secondary turn winding has at least two turns.

Example 16 is a method of manufacturing a transformer comprising: stacking wire elements above a substrate to form stacked wire elements; connecting a first wire section of a shared wire element to the stacked wire elements to form a primary turn winding, the shared wire element including the first wire section and a second wire section in parallel spaced relation; and connecting the second wire section of the shared wire element to a secondary wire element to form a secondary turn winding such that the secondary wire element partially overlaps the primary turn winding.

In Example 17, the subject matter of Example 16 optionally includes wherein the first section of the shared wire element and the second section of the shared wire element are on the same plane.

In Example 18, the subject matter of any one or more of Examples 16-17 optionally include wherein the first wire section and second wire section are metal traces.

In Example 19, the subject matter of Example 18 optionally includes wherein each metal trace is made from a material having a resistance less than a resistance of the stacked wire elements.

In Example 20, the subject matter of any one or more of Examples 16-19 optionally include wherein the shared wire element is copper and the secondary wire element is aluminum.

Example 21 is a method of manufacturing a transformer comprising: stacking wire elements on a substrate to form stacked wire elements; placing a primary turn winding on the stacked wire elements, the primary turn winding including a first wire section and a second wire section in parallel spaced relation; placing a secondary turn winding on the stacked wire elements between the parallel spaced apart first and second wire sections to align an equivalent current flow of the primary turn winding with the current flow of the secondary turn winding vertically.

In Example 22, the subject matter of Example 21 optionally includes connecting the primary turn winding to the secondary turn winding to form a vertical bridge element.

In Example 23, the subject matter of any one or more of Examples 21-22 optionally include wherein the primary turn winding comprises two metal traces and secondary turn winding comprises a single metal trace.

In Example 24, the subject matter of Example 23 optionally includes wherein a resistance of the metal traces of the primary turn winding and secondary turn winding are each less than a resistance of the stacked wire elements.

In Example 25, the subject matter of any one or more of Examples 21-24 optionally include wherein the primary turn winding has at least two turns and a winding of a first turn of the primary turn winding has a different width than a winding of a second turn of the primary turn winding.

Each of these non-limiting aspects may stand on its own, or may be combined in various permutations or combinations with one or more of the other aspects.

The above detailed description includes references to the accompanying drawings, which form a part of the detailed description. The drawings show, by way of illustration, specific aspects in which the invention may be practiced. These aspects are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other aspects may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description as examples or aspects, with each claim standing on its own as a separate aspect, and it is contemplated that such aspects may be combined with each other in various combinations or permutations. The scope of the invention should be determined with reference to the appended claims, along with the full scope of equivalents to which such claims are entitled.

What is claimed:

1. A stacked inductance apparatus, comprising:
   a first winding comprising a first wire section and a second wire section, the first wire section and the second wire section are disposed parallel to each other in a first horizontal plane associated with a center axis, and the first winding associated with an equivalent current flow path within the first horizontal plane;
   a second winding, the second winding associated with a current flow path, the second winding positioned in the first horizontal plane between the first wire section and the second wire section to align the equivalent current flow path of the first winding with the current flow path of the second winding; and
   at least one wire section, the at least one wire section extending from the second winding and disposed on a second horizontal plane, the second horizontal plane being parallel to the first horizontal plane.
2. The apparatus according to claim 1, wherein the first winding connects with the second winding at a bridge element.
3. The apparatus according to claim 2, wherein at the bridge element a vertically displaced via connects the first winding to the second winding.
4. The apparatus according to claim 2, wherein the bridge element comprises a plurality of wire sections extending from the second winding and disposed on the second horizontal plane, the plurality of wire sections including the at least one wire section.
5. The apparatus according to claim 2, wherein the first winding and second winding are made from a material having a resistance of less than a resistance of a material of the bridge element.
6. The apparatus of claim 1, wherein the first and second wire sections of the first winding are metal traces.
7. The apparatus of claim 1, wherein the second winding is a metal trace.
8. The apparatus of claim 1, wherein the first winding has at least two turns.
9. The apparatus of claim 8, wherein the second winding has at least two turns.
10. A method of manufacturing an inductance apparatus, comprising:
    stacking wire elements above a substrate to form stacked wire elements;
    connecting a first wire section of a shared wire element to the stacked wire elements to form a first winding, the shared wire element including the first wire section and a second wire section disposed in a parallel spaced relation within a first horizontal plane; and
    connecting the second wire section of the shared wire element to a secondary wire element of the stacked wire elements to form a second winding such that the secondary wire element is in a second horizontal plane, partially overlaps the first winding, and fully overlaps the second winding.
11. The method of claim 10, further comprising:
    configuring a partial overlap of the secondary wire element with the first winding based on a mutual coupling factor of the inductance apparatus.
12. The method of claim 10, wherein the first wire section and the second wire section are metal traces.
13. The method of claim 12, wherein each of the metal traces is made from a material having a resistance less than a resistance of the stacked wire elements.
14. The method of claim 10, wherein the shared wire element is made of copper and the secondary wire element is made of aluminum.
15. A method of manufacturing an inductance apparatus, comprising:
    stacking wire elements on a substrate to form stacked wire elements;
    placing a first winding on the stacked wire elements, the first winding including a first wire section and a second wire section in a parallel spaced relation within a horizontal plane; and
    placing a second winding on the stacked wire elements between the first and second wire sections within the horizontal plane to vertically align an equivalent current flow of the first winding with a current flow of the second winding.
16. The method of claim 15, further comprising:
    connecting the first winding to the second winding to form a vertical bridge element.
17. The method of claim 15, wherein the first winding comprises two metal traces and the second winding comprises a single metal trace.
18. The method of claim 17, wherein a resistance of the metal traces of the first winding and the second winding are each less than a resistance of the stacked wire elements.
19. The method of claim 15, wherein the first winding has at least two turns and a winding of a first turn of the first winding has a different width than a winding of a second turn of the first winding.

* * * * *